US010437162B2

(12) United States Patent
Bessems et al.

(10) Patent No.: US 10,437,162 B2
(45) Date of Patent: Oct. 8, 2019

(54) METHODS AND APPARATUSES FOR PROTECTING A SEAL IN A PRESSURE VESSEL OF A PHOTOLITHOGRAPHY SYSTEM

(71) Applicant: ASML Netherlands B.V., Veldhoven (NL)

(72) Inventors: David Bessems, San Diego, CA (US); Jon David Tedrow, San Diego, CA (US); Colin Michael Odneal, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/711,678

(22) Filed: Sep. 21, 2017

(65) Prior Publication Data

US 2019/0086817 A1 Mar. 21, 2019

(51) Int. Cl.
*G03F 7/20* (2006.01)

(52) U.S. Cl.
CPC ...... *G03F 7/70841* (2013.01); *G03F 7/70033* (2013.01)

(58) Field of Classification Search
CPC .... H05G 2/005; H05G 2/008; G03F 7/70341; G03F 7/70841

USPC ...................................................... 355/27, 30
See application file for complete search history.

(56) References Cited

U.S. PATENT DOCUMENTS

2014/0261761 A1* 9/2014 Vaschenko ............. H05G 2/005
137/334

FOREIGN PATENT DOCUMENTS

| WO | 2009117048 A2 | 9/2009 |
| WO | 2010117801 A1 | 10/2010 |
| WO | 2011082894 A1 | 7/2011 |

OTHER PUBLICATIONS

International Search for for PCT/EP2018/074057 dated Nov. 30, 2018.

* cited by examiner

*Primary Examiner* — Hung Nguyen
(74) *Attorney, Agent, or Firm* — Arent Fox LLP (57) ABSTRACT

A vessel having a seal that is protected from the liquid material within the vessel by a volume of gas. The vessel has a partition that divides the vessel into two volume spaces such that the seal that is in gaseous communication with the first volume space is protected from the liquid material in the second volume space by a volume of gas in the first volume space.

27 Claims, 7 Drawing Sheets

Fig. 7 though the invention relates to methods and apparatuses for sealing a vessel. More particularly, the present invention relates to methods and apparatuses for protecting a seal using a captured gas volume.

METHODS AND APPARATUSES FOR PROTECTING A SEAL IN A PRESSURE VESSEL OF A PHOTOLITHOGRAPHY SYSTEM

BACKGROUND

The present invention relates to methods and apparatuses for sealing a vessel. More particularly, the present invention relates to methods and apparatuses for protecting a seal using a captured gas volume.

Pressure is an important parameter in many modern industrial and technological processes. In manufacturing, for example, many fluids may be pressurized for the purpose of transporting, ejecting, spraying, applying force, and the like. In particular, photolithography systems that employ extreme ultraviolet (EUV) light for exposing wafers often generate their EUV light by irradiating molten targets (for example tin targets) with laser light. The molten tin targets are pressurized at a high pressure (typically in the range of thousands of PSI) and delivered from a molten tin reservoir to the irradiation site. In a typical scenario, the tin droplets are ejected out of the nozzle of a droplet generator system. The molten target material delivery system that delivers the molten target material (e.g., tin) from one or more molten target material reservoirs to the droplet generator system often employs one or more pressure vessels in order to help dampen vibration and smooth out the pressure profile during the startup phase, for example. These pressure vessels require seals capable of operating across a wide range of temperatures and pressures. Embodiments of the invention are directed to protecting the seals of vessels such as (without limitation) the pressure vessels employed in the molten target material delivery system of a photolithography tool.

SUMMARY OF THE INVENTION

The invention relates, in an embodiment, to a photolithography system having a molten target material delivery system, the molten target material delivery system delivering molten target material at least from a first location to a second location. The system comprises a vessel disposed in the fluid path between the first location and the second location and in fluidic communication with both the first location and the second location. The vessel includes a vessel wall enclosing at least an inner volume space. The vessel also includes a partition disposed within the vessel wall, the partition dividing the inner volume space into at least a first volume space and a second volume space, the partition configured to permit gaseous communication between the first volume space and the second volume space when no molten material is present within the inner volume space, the first volume space trapping at least a portion of a gas that exists within the first volume space when molten target material is present in the second volume space. The vessel further includes an inlet port and an outlet port, the second volume space being in fluidic communication with both the inlet port and the outlet port. The vessel additionally includes a seal disposed such that the seal is in gaseous communication with the first volume space and the second volume space when the molten target material is absent from the second volume space, the seal being in gaseous communication with the trapped gas within the first volume space and not in gaseous communication with the second volume space when the molten target material is present in the second volume space.

In another embodiment, the invention relates to a photolithography system having a molten target material delivery system, the molten target material delivery system delivering molten target material at least from a first location to a second location. The system includes a vessel disposed in a fluid path between the first location and the second location and in fluidic communication with both the first location and the second location. The vessel includes a vessel wall enclosing at least an inner volume space. The vessel also includes a partition that divides the inner volume space into a first volume space and a second volume space, wherein the first volume space and the second volume space are in gaseous communication when a first quantity of molten target material is present in the second volume space, the first volume space and the second volume space are not in gaseous communication due to being blocked by the molten target material when a second quantity of molten target material is present in the second volume space, the second quantity of molten target material being greater than the first quantity of the molten target material. The vessel additionally includes a seal in gaseous communication with the first volume space.

In yet another embodiment, the invention relates to a photolithography system having a molten target material delivery system, the molten target material delivery system delivering molten target material at least from a first location to a second location. The system includes a vessel disposed in a fluid path between the first location and the second location and in fluidic communication with both the first location and the second location. The vessel includes an vessel wall enclosing at least an inner volume space, the inner volume space including a first volume space and a second volume space, wherein the first volume space and the second volume space are in gaseous communication via a channel when a first quantity of molten target material is present in the second volume space, the first volume space and the second volume space are not in gaseous communication due to the channel being blocked by the molten target material when a second quantity of molten target material is present in the second volume space, the second quantity of molten target material being greater than the first quantity of the molten target material. The vessel also includes a seal in gaseous communication with the first volume space.

BRIEF DESCRIPTION OF THE DRAWINGS

The present invention is illustrated by way of example, and not by way of limitation, in the figures of the accompanying drawings and in which like reference numerals refer to similar elements and in which.

DESCRIPTION OF ON OR MORE EMBODIMENTS OF THE INVENTION

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Embodiments of the invention relate to methods and apparatuses for protecting a seal in a vessel. In one or more embodiments, the vessel is surrounded by a vessel wall such that an inner volume space is enclosed. The pressure vessel may be made up of at least two vessel subassemblies. When these two vessel subassemblies mate to create the inner volume space, a seal is employed to render the mating surfaces between the two vessel subassemblies leak-proof.

The inner volume space may include a first volume space and a second volume space, with the first volume space in fluidic communication with the second volume space via a channel. The first volume space and the second volume space may be created by a partition within the vessel, and the channel may for example be located at the bottom of the partition or may for example be created by a through-hole (i.e., via) in the partition. The second volume space is in fluidic communication with an inlet port for receiving a fluid and an outlet port for outputting the fluid that previously entered via the inlet port. When the pressure vessel is empty, the first volume space and the second volume space are in gaseous communication via the aforementioned channel. As a fluid enters the pressure vessel via the inlet port, the fluid begins to fill up the second volume space, and at some point while the fluid level has risen enough within the second volume space, the fluid blocks the channel.

The blocking of the channel prevents gas from the first volume space to be in gaseous communication with the second volume space. Further, when the fluid blocks the channel, gas is trapped within the first volume space. As the fluid gradually fills the second volume space, a quantity of gas remained trapped within the first volume space. The volume of the trapped gas becomes smaller and smaller as pressure increases within the pressure vessel (i.e., within the second volume space and within the first volume space). However, the volume of this trapped gas will be non-zero since there is no escape path for the trapped gas after the channel is blocked. This non-zero volume of trapped gas keeps the seal from coming into contact with the fluid inside the inner volume space and more specifically keeps the seal from coming into contact with any fluid inside the first volume space. When the second volume space is completely filled with the fluid and the fluid flows out of the outlet port, a non-zero trapped gas volume still exists within a portion of the first volume space to continue to separate the fluid from the seal. In this manner, the seal is protected from coming into contact with the fluid, which may contribute to protecting the seal.

In one or more embodiments, the pressure vessel is a component of a molten material delivery system, such as a molten target material delivery system in an extreme ultraviolet (EUV) photolithography tool. To elaborate, the molten target material (typically tin or one of its alloys although any other suitable target material may be employed) is delivered from a reservoir to a droplet generator for creating droplets. The droplets are ejected by a nozzle into an interior of a chamber where they are irradiated at an irradiation site by a laser beam. The droplets may be irradiated by one or more laser pre-pulses and one or more laser main pulses, in one or more variation of the photolithography tool, in order to create a plasma from the droplets and to generate the EUV light for use in photolithography processing of wafers. EUV photolithography tools are known in the art and will not be further elaborated here.

In one or more embodiments, the pressure vessel is a component of the molten target material delivery system and is disposed in between two locations along the molten target material fluid path. The two locations may be, for example, the molten target material reservoir and the droplet generator system, which includes the aforementioned nozzle. These two locations may also represent any other arbitrary two locations along the fluid path between the molten target material reservoir and the nozzle, which is to say the exact location of the pressure vessel along the fluid path is not a limiting of the scope of the invention.

The pressure vessel may be empty prior to commencement of operation and may thus be in a vacuum state or may have some gas in the pressure vessel. Prior to operation of the photolithography tool, one or more gas purge cycles may be performed to ensure gaseous and non-gaseous contaminants are removed from the molten target material delivery system. During the purging operation, one or more purge gases may be employed and the pressure within fluid path of the molten target material delivery system may alternatively be increased and reduced (e.g., to a vacuum or near vacuum state if desired) to perform the purging with one or more purging gases. Once purging is complete, the molten target material may begin to flow from the molten target material reservoir to the nozzle where droplets of molten target material may be ejected toward the aforementioned irradiation site.

Since the pressure vessel (and there may be one or multiple pressure vessels if desired) is disposed between the molten target material reservoir and the nozzle, the molten target material would begin to flow into the inlet port of the pressure vessel during the startup phase as the molten target material travels along the fluid path between the reservoir and the nozzle. This begins the process of filling up the aforementioned second volume space within the pressure vessel. The quantity (and thus volume) of the molten target material within the pressure vessel continues to increase and at some point will block the communication channel between the second volume space and the aforementioned first volume space. At this point, a volume of gas is trapped within the first volume space and is disposed between the seal and the molten target material in the pressure vessel.

As the molten target material continues to fill up the second volume space, pressure within the pressure vessel may increase and may cause the trapped gas in the first volume space to shrink in volume. However because the trapped gas within the first volume space is blocked from being released when the molten target material blocks the communication channel, the trapped gas will continue to have a non-zero volume since the gas molecules of the trapped gas has no escape route. This volume of trapped gas will continue to keep the seal physically separated from the molten target material, thereby continuing to protect the seal even after the molten target material completely fills the second volume space and flows out of the outlet port of the vessel chamber on its way to the nozzle.

During operation, the pressure within the molten target material delivery system may reach thousands of PSI and the temperature experienced by the seal may be at or near the temperature range that causes the molten target material to stay molten (i.e., relatively high temperature). However, since the trapped gas volume within the first volume space keeps the seal physically separated from the molten target material, the seal may be protected to a much greater degree and the useful life of the seal may be significantly prolonged.

The features and advantages of embodiments of the invention will be better understood with reference to the figures that follow.

Figure 1:
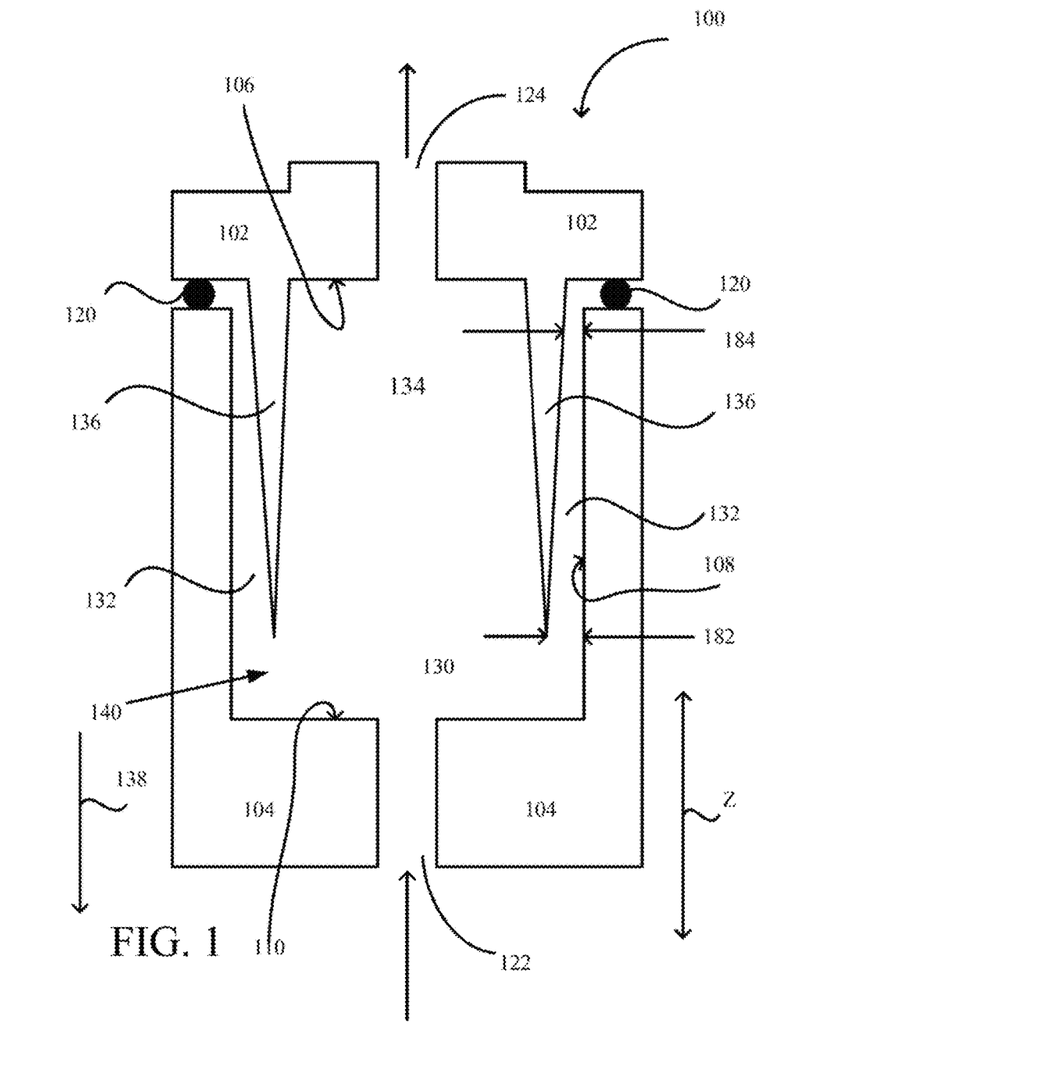
FIG. 1 shows, in accordance with an embodiment of the invention, a side view of a pressure vessel having a first pressure vessel subassembly and a second pressure vessel subassembly.

FIG. 1 shows, in accordance with an embodiment of the invention, a side view of a pressure vessel 100 having a first pressure vessel subassembly 102 and a second pressure vessel subassembly 104. In the example of FIG. 1, pressure vessel 100 is roughly cylindrical in shape although any suitable shape may be employed. For many reasons, including for example ease of manufacture, ease of assembly, ease of maintenance, etc., a plurality of pressure vessel subassemblies may be manufactured and assembled together to create the pressure vessel. Although only two subassemblies are shown in FIG. 1, a pressure vessel may be formed from any number of subassemblies.

Pressure vessel 100 has a vessel wall that includes walls 106, 108, and 110. Wall 106 is part of pressure vessel subassembly 102 while wall 108 (a cylindrical wall in the example of the side view of FIG. 1) and wall 110 are parts of pressure vessel subassembly 104. When assembled together, a seal 120 (in the form of an O-ring in the example of FIG. 1 but may have any other form factor as desired) is disposed between the two subassemblies 102 and 104 to prevent the leakage of gas or fluid. When properly assembled, walls 106, 108, and 110 form a vessel wall that encloses an inner volume space 130.

Wall 110 has an inlet port 122, and wall 106 has an outlet port 124. Inner volume space 130 includes a first volume space 132 and a second volume space 134. A partition 136, which is integrated with or made a part of first pressure vessel subassembly 102, extends in the direction of arrow 138 (in the direction of gravity) toward wall 110, creating a channel 140 that allows gaseous communication between first volume space 132 and second volume space 134 when channel 140 is not blocked.

Seal 120 is disposed such that it is in gaseous communication with first volume space 132 as shown. When there is no molten target material in inner volume space 130, channel 140 is not blocked and seal 120 is also in gaseous communication with second volume space 134 via first volume space 132 and channel 140.

Figure 2:
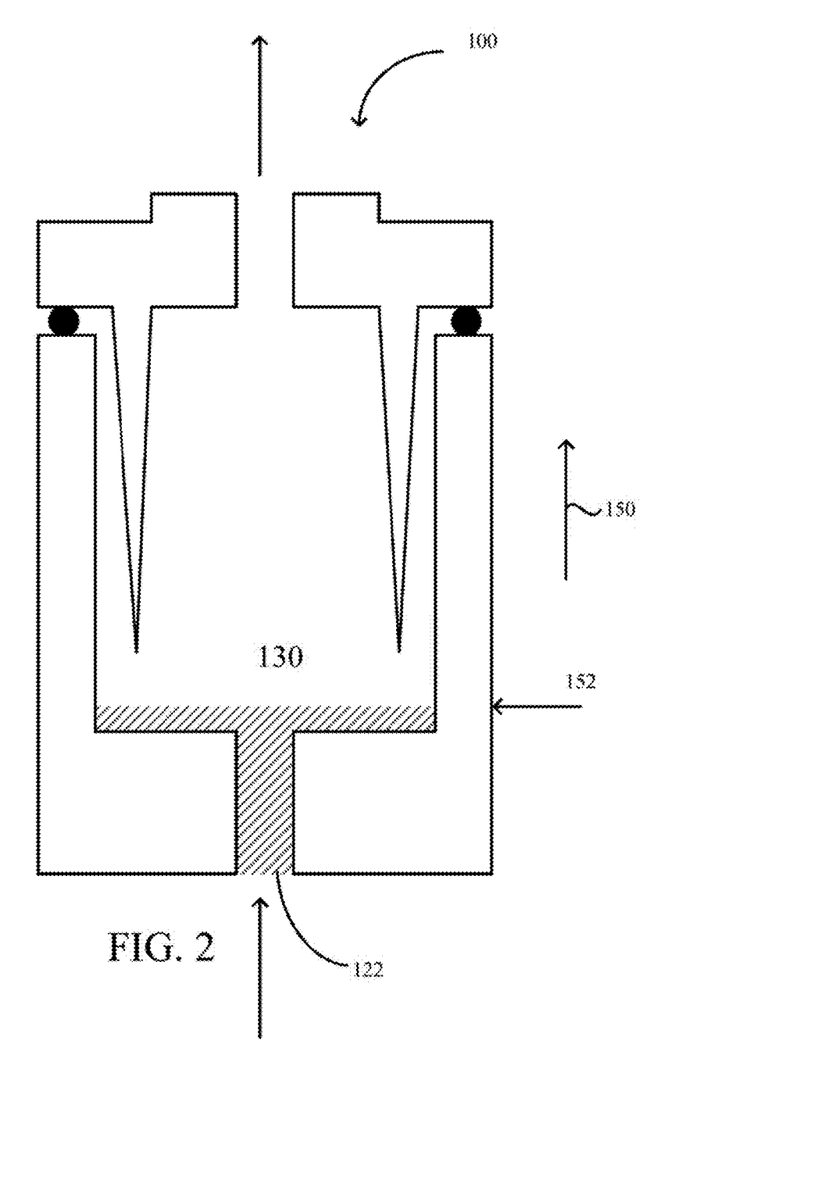
FIG. 2 shows, in accordance with an embodiment of the invention, the pressure vessel of FIG. 1 with molten target material beginning to flow into inner volume space of the pressure vessel.

In FIG. 2, when molten target material is flowed into inner volume space 130 of pressure vessel 100 (via inlet port 122), the level of molten target material will rise over time in inner volume space 130. Due to gravity (whether natural gravity or induced gravity such by using centrifugal force), the level of molten target material will rise in the direction of arrow 150 (the direction of arrow 150 itself is against gravity). In the example of FIG. 2, the level currently rests at reference number 152.

Figure 3:
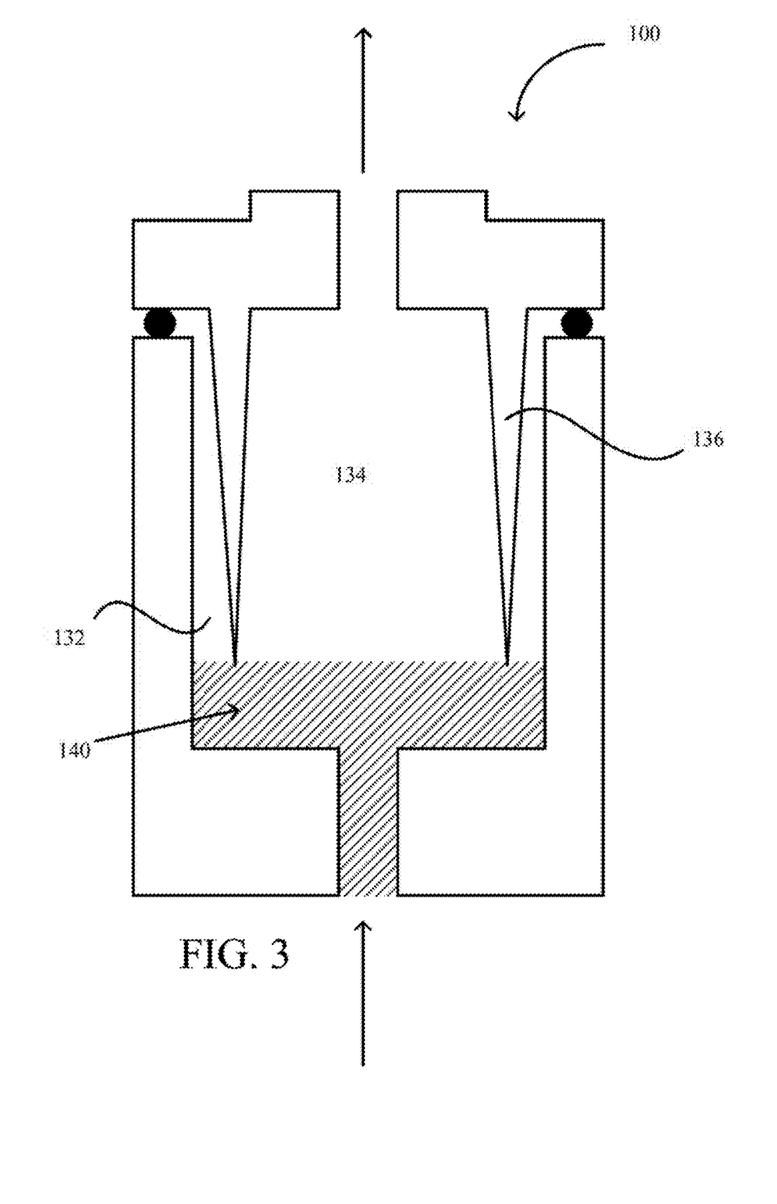
FIG. 3 shows, in accordance with an embodiment of the invention, the pressure vessel of FIG. 1 with molten target material being flowed into inner volume space of the pressure vessel and reaching the bottom of the partition.

In FIG. 3, the level of the molten target material reaches the bottom of partition 136, thus blocking channel 140 and not permitting first volume space 132 to stay in gaseous communication with second volume space 134. Thus a volume of gas is now trapped in first volume space 132.

Figure 4:
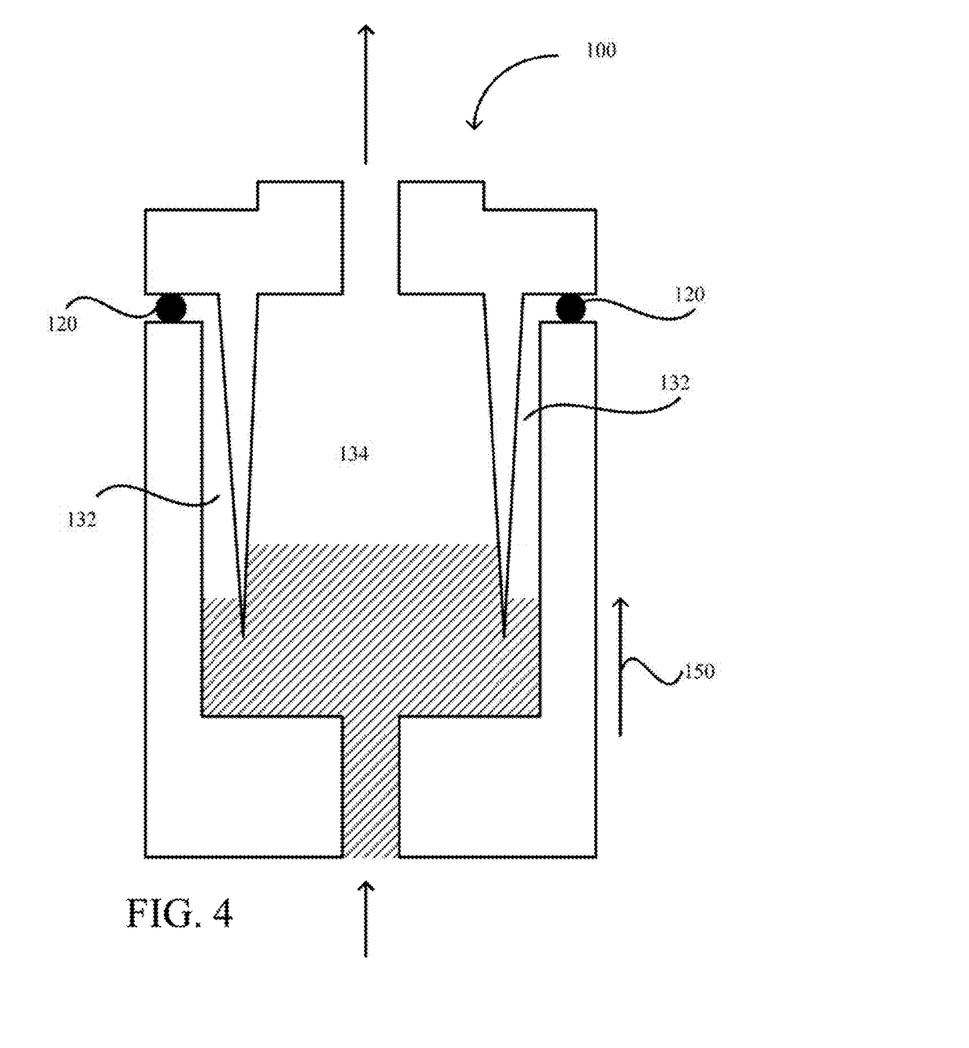
FIG. 4 shows, in accordance with an embodiment of the invention, the pressure vessel of FIG. 1 with molten target material being flowed into inner volume space of the pressure vessel and rising above the bottom of the partition.

In FIG. 4, the molten target material continues to be flowed into the interior space of pressure vessel 100, namely into second volume space 134 of inner volume space 130. This causes the level of the molten target material in second volume space 134 to rise higher (in the direction of arrow 150). The addition of the molten target material increases the pressure within the molten target material delivery system in general and within second volume space 134 in particular. The increased pressure also exerts on first volume space 132, causing the trapped gas within first volume space 132 to shrink. However, since there is no escape port for the trapped gas, there remains a finite, non-zero volume of trapped gas between seal 120 and the molten target material. The trapped gas physically keep seal 120 from coming into contact with the molten target material, thereby improving the life of the seal/O-ring.

Figure 5:
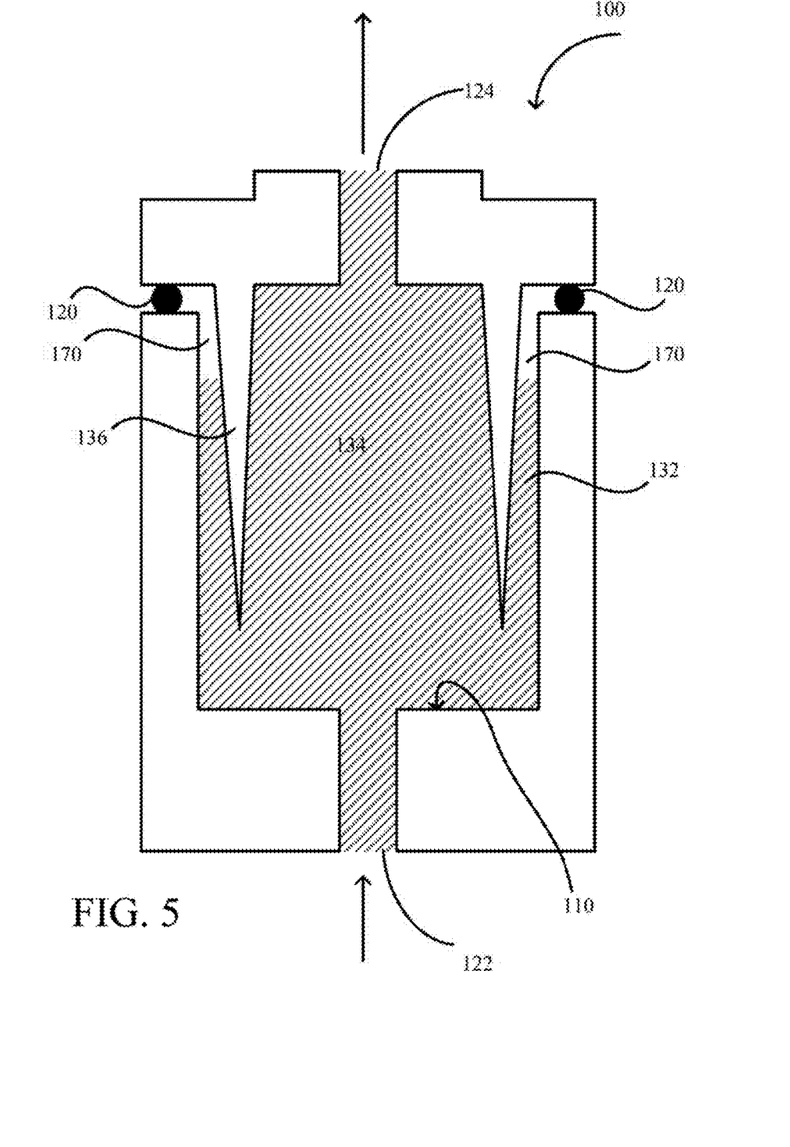
FIG. 5 shows, in accordance with an embodiment of the invention, the pressure vessel of FIG. 1 with molten target material being flowed into inner volume space of the pressure vessel and filling one of the inner volume spaces without contacting the seal.

In FIG. 5, the molten target material fills up the second volume space 134 and flows out of outlet port 124 on its way to the nozzle, for example. The pressure continues to increase to reach the operating pressure threshold (e.g., around 4,000 PSI in an implementation). This pressure continues to shrink down the volume of the trapped gas within first volume space 132. However, there remains a finite, non-zero volume of trapped gas 170 between seal 120 and the molten target material adjacent to the O-ring.

Seal 120 may be made of an elastomer that can withstand the high operating temperature as well as the high operating pressure ranges. In other embodiments, seal 120 may be made of any suitable material such as a metal or even a hybrid material. In yet other embodiments, the seal may take the physical form of a flat sealing washer or any other form. The point is neither the exact physical form for the seal nor its chemical composition is relevant or limiting of the scope of embodiments of the invention herein.

FIGS. 1-5 show a partition 136 protruding downward (toward wall 110), and the partition ends before reaching wall 110. The gap between downward-pointing end of the partition wall 136 and wall 110 creates the aforementioned channel, as has been discussed herein. In other embodiments, the partition may reach all the way to wall 110 and one or more through-holes may be present in partition 136 to form one or more channels to allow gaseous communication between the first volume space (where the gas is trapped) and the second volume space when the molten target material is not present in the pressure vessel.

In the example of FIGS. 1-5, the first volume space 132 has a tapered shape wherein the base (182 in FIG. 1) is wider than the top (184 in FIG. 1) toward where the seal 120 is disposed. This shape is optional and not always required, but the shape does offer advantages in some embodiments. This shape permits the column of trapped gas near top 184 to maintain a relative large separation in the Z direction (see arrow Z in FIG. 3) with relatively little gas volume. Thus, as the trapped gas inside first volume space 132 is pressurized and shrinks in volume, a large separation in the Z direction between the seal and the molten target material may still be maintained even if the trapped gas inside the first volume space 132 is shrunk to only a small percentage of its original volume.

In another embodiment, there are provided apparatuses and methods for reducing rotation between components when installing a fluid connection. The components may be male and female glands. The fluid connection may form part of a lithographic apparatus, for example. A known method of forming a fluid connection (i.e., a connection between parts through which fluid may flow) includes placing a gasket between a male gland and a female gland and bringing the glands closer together to crush the gasket between the glands, thus forming a seal.

The glands may be brought closer together by rotating a tightening nut in a threaded passage within the female gland. However, during rotation of the tightening nut the male gland may undesirably rotate with respect to the female gland due to friction between the tightening nut and the male gland.

Relative rotation of the glands may result in misalignment of the parts that are being connected by the fluid connection, unwanted torque acting on the parts that are being connected and/or damage being caused to the glands. A damaged gland may result in a reduced lifetime of the fluid connection and/or an increased risk of leakage from the fluid connection. One technique of reducing relative rotation of the glands when installing a fluid connection is to provide an insert comprising a protrusion and a female gland comprising a recess for receiving the protrusion in the fluid connection.

Figure 6A:
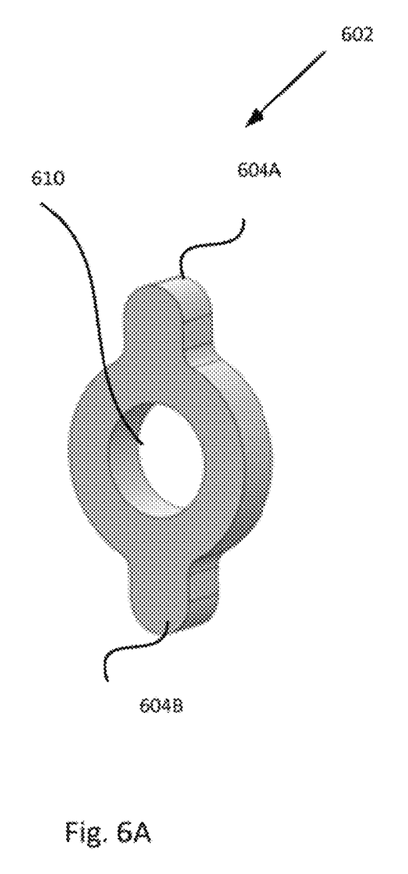
FIGS. 6A and 6B show, in accordance with an embodiment of the invention, an anti-rotation insert comprising protrusions and a female gland comprising recesses.
Figure 6B:
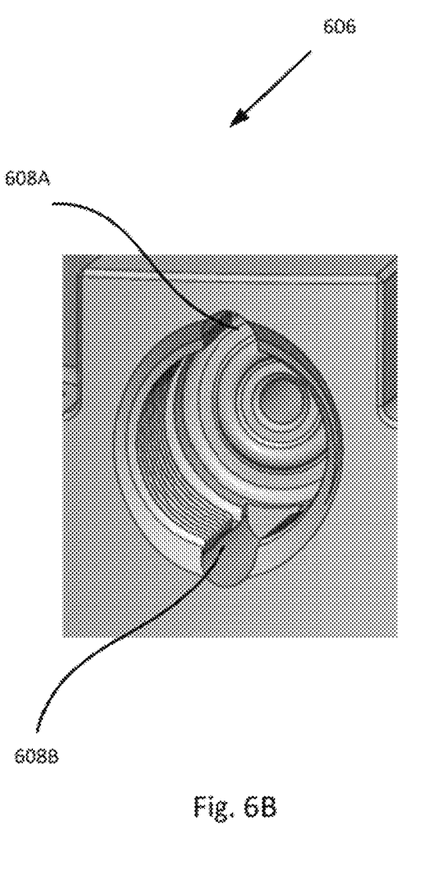

FIGS. 6A and 6B schematically depict, in accordance with an embodiment of the invention, an anti-rotation insert 602 comprising protrusions 604a and 604b and a female gland 606 comprising recesses 608a and 608b. The insert 602 comprises an aperture 610 for receiving a male gland (e.g., 702 in FIG. 7). In the example of FIGS. 6A and 6B, the insert comprises two protrusions and the female gland comprises two recesses. The insert may have a greater or smaller number of protrusions. The female gland may have a greater or smaller number of recesses. In general, the protrusion of the insert and the recess in the female gland are configured to be complimentary shapes such that the protrusion of the insert fits into the recess of the female gland. When the insert has been inserted into the female gland the protrusions are configured to abut against the walls of the recesses such that relative rotation between the insert and the glands is reduced, constrained, or eliminated.

Figure 7:
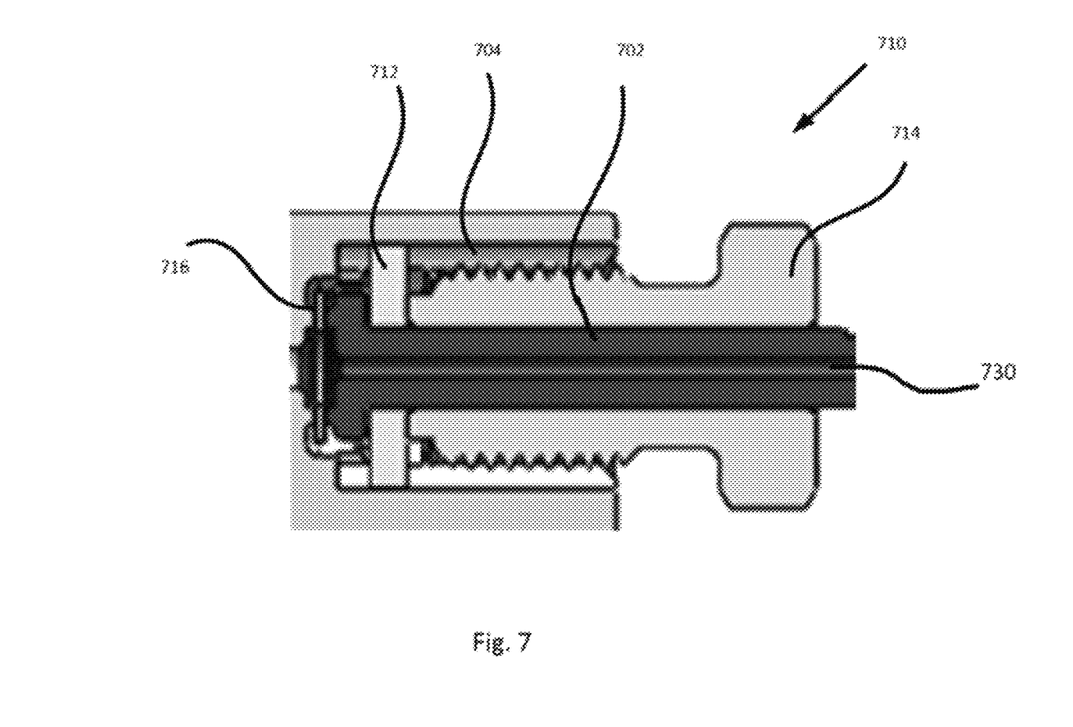
FIG. 7 schematically depicts, in accordance with an embodiment of the invention, a fluid connection comprising an insert having one or more protrusions and a female gland comprising one or more recesses.

FIG. 7 schematically depicts, in accordance with an embodiment of the invention, a fluid connection 710 comprising an insert 712 having one or more protrusions and a female gland 704 comprising one or more recesses. The male gland 702 comprises a fluid passage 730 that allows fluid to pass through the fluid connection. The male gland 702 is inserted through an aperture of the insert 712. The insert 712 and the male gland 702 are then inserted into the female gland 704. A tightening nut 714 is rotated within a thread of the female gland 704 such that a gasket 716 is crushed between the male gland 702 and the female gland 704, thus sealing the fluid connection. The protrusions of the insert abut against the walls of the recesses of the female gland (as discussed in connection with FIGS. 6A and 6B) during rotation of the tightening nut 714, thereby reducing relative rotation between the male gland 702 and the female gland 704. The insert comprising one or more protrusions and the female gland comprising one or more recesses described and depicted herein advantageously reduces rotation between male and female glands in a fluid connection, thereby improving the quality of the fluid connection and/or increasing the operable lifetime of the fluid connection. Such a fluid connection may exist (but not required to exist) between a fluid line and an inlet port or an outlet port of the vessel of FIGS. 1-5 for example.

While this invention has been described in terms of several preferred embodiments, there are alterations, permutations, and equivalents, which fall within the scope of this invention. For example, while embodiments of the invention is described with reference to a pressure vessel, embodiments of the invention also apply to any two parts that require a seal that is disposed in between to be protected by a gaseous pocket and should be understood to also cover such arrangements. The invention should be understood to also encompass these alterations, permutations, and equivalents. It should also be noted that there are many alternative ways of implementing the methods and apparatuses of the present invention. Although various examples are provided herein, it is intended that these examples be illustrative and not limiting with respect to the invention.

What is claimed is:

1. A photolithography system having a molten target material delivery system, the molten target material delivery system delivering molten target material at least from a first location to a second location, comprising:
   a vessel disposed in a fluid path between the first location and the second location and in fluidic communication with both said first location and said second location, said vessel including:
   a vessel wall enclosing at least an inner volume space;
   a partition disposed within said vessel wall, said partition dividing said inner volume space into at least a first volume space and a second volume space, said partition configured to permit gaseous communication between said first volume space and said second volume space when no molten material is present within said inner volume space, said first volume space configured to trap at least a portion of a gas that exists within said first volume space when molten target material is present in said second volume space;
   an inlet port;
   an outlet port, said second volume space being in fluidic communication with both said inlet port and said outlet port; and
   a seal disposed such that said seal is in gaseous communication with both said first volume space and said second volume space when said molten target material is absent from said second volume space, said seal configured to be in gaseous communication with said trapped gas within said first volume space and not in gaseous communication with said second volume space when said molten target material is present in said second volume space.

2. The photolithography system of claim 1 wherein said molten target material is molten tin.

3. The photolithography system of claim 1 wherein said vessel is a pressure vessel.

4. The photolithography system of claim 1 wherein said seal is formed of an elastomer.

5. The photolithography system of claim 1 wherein said seal is an O-ring.

6. The photolithography system of claim 1 wherein the first volume space has a tapered shape that tapers toward the seal.

7. The photolithography system of claim 1 wherein said partition includes one or more through-holes between said first volume space and said second volume space.

8. The photolithography system of claim 1 wherein at least one of said inlet port and said outlet port is coupled to a fluid line using an anti-rotation insert having protrusions.

9. A photolithography system having a molten target material delivery system, the molten target material delivery system delivering molten target material at least from a first location to a second location, comprising:
  a vessel disposed in a fluid path between the first location and the second location and in fluidic communication with both said first location and said second location, said vessel including:
    a vessel wall enclosing at least an inner volume space;
    a partition that divides said inner volume space into a first volume space and a second volume space, wherein said first volume space and said second volume space are configured to be in gaseous communication when a first quantity of molten target material is present in said second volume space, said first volume space and said second volume space are configured to be not in gaseous communication with one another when a second quantity of molten target material is present in said second volume space and said molten target material blocks said gaseous communication, said second quantity of molten target material being greater than said first quantity of said molten target material; and
    a seal in gaseous communication with said first volume space.

10. The photolithography system of claim 9 wherein said molten target material is molten tin.

11. The photolithography system of claim 9 wherein said vessel is a pressure vessel.

12. The photolithography system of claim 9 wherein said seal is formed of an elastomer.

13. The photolithography system of claim 9 wherein said seal is an O-ring.

14. The photolithography system of claim 9 wherein the first volume space has a tapered shape that tapers toward the seal.

15. The photolithography system of claim 9 wherein said partition includes one or more through-holes between said first volume space and said second volume space.

16. The photolithography system of claim 9 wherein at least one of said inlet port and said outlet port is coupled to a fluid line using an anti-rotation insert having protrusions.

17. A photolithography system having a fluid material delivery system, the fluid material delivery system delivering fluid material at least from a first location to a second location, comprising:
  a vessel disposed in a fluid path between the first location and the second location and in fluidic communication with both said first location and said second location, said vessel including:
    a vessel wall enclosing at least an inner volume space, said inner volume space including a first volume space and a second volume space, wherein said first volume space and said second volume space are configured to be in gaseous communication via a channel when a first quantity of fluid material is present in said second volume space, said first volume space and said second volume space are configured to be not in gaseous communication via said channel when a second quantity of fluid material is present in said second volume space and said fluid material blocks said channel, said second quantity of fluid material being greater than said first quantity of said fluid material; and
    a seal in gaseous communication with said first volume space.

18. The photolithography system of claim 17 wherein said seal is not in gaseous communication with said second volume space when said second quantity of said molten.

19. The photolithography system of claim 18 wherein a quantity of trapped gas is disposed between said fluid material and said seal when said second quantity of said molten material is present in said second volume space.

20. The photolithography system of claim 17 wherein said fluid material is molten tin.

21. The photolithography system of claim 17 wherein said seal is an O-ring.

22. The photolithography system of claim 17 wherein the first volume space has a tapered shape that tapers toward the seal.

23. The photolithography system of claim 17 wherein said partition includes one or more through-holes between said first volume space and said second volume space.

24. The photolithography system of claim 17 wherein at least one of said inlet port and said outlet port is coupled to a fluid line using an anti-rotation insert having protrusions.

25. The photolithography system of claim 17 wherein said second volume is greater than a threshold volume, wherein the threshold volume depends on a geometry of the channel.

26. The photolithography system of claim 17 wherein said second volume is greater than a threshold volume, wherein the threshold volume depends on a geometry of the channel and an orientation of the vessel with respect to gravity.

27. A fluid material delivery system, the fluid material delivery system delivering fluid material at least from a first location to a second location, comprising:
  a vessel disposed in a fluid path between the first location and the second location and in fluidic communication with both said first location and said second location, said vessel including:
    a vessel wall enclosing at least an inner volume space, said inner volume space including a first volume space and a second volume space, wherein said first volume space and said second volume space are configured to be in gaseous communication via a channel when a first quantity of fluid material is present in said second volume space, said first volume space and said second volume space are configured to be not in gaseous communication via said channel when a second quantity of fluid material is present in said second volume space and said fluid material blocks said channel, said second quantity of fluid material being greater than said first quantity of said fluid material; and
    a seal in gaseous communication with said first volume space.

* * * * *